United States Patent
Syed et al.

(10) Patent No.: US 12,557,237 B2
(45) Date of Patent: Feb. 17, 2026

(54) MICRODATA CENTER POWER PANEL

(71) Applicant: SCHNEIDER ELECTRIC IT CORPORATION, Foxboro, MA (US)

(72) Inventors: Farrukh Shahzad Syed, O'Fallon, MO (US); Jonathan H. Rathjen, High Ridge, MO (US)

(73) Assignee: Schneider Electric IT Corporation, Foxboro, MA (US)

(*) Notice: Subject to any disclaimer, the term of this patent is extended or adjusted under 35 U.S.C. 154(b) by 315 days.

(21) Appl. No.: 18/369,901

(22) Filed: Sep. 19, 2023

(65) Prior Publication Data

US 2025/0098101 A1    Mar. 20, 2025

(51) Int. Cl.
  *H05K 7/00* (2006.01)
  *H05K 7/14* (2006.01)
  *H05K 7/20* (2006.01)

(52) U.S. Cl.
  CPC ....... *H05K 7/1492* (2013.01); *H05K 7/20818* (2013.01)

(58) Field of Classification Search
  CPC .......... H05K 7/1492; H05K 7/20818
  USPC ......................................... 361/652
  See application file for complete search history.

(56) References Cited

U.S. PATENT DOCUMENTS

| | | | |
|---|---|---|---|
| 9,373,956 B2 | 6/2016 | Jansma | |
| 9,766,670 B1* | 9/2017 | Czamara | H02J 3/14 |
| 10,499,531 B2* | 12/2019 | Schmidt | H05K 7/1492 |
| 11,799,273 B1* | 10/2023 | Hack | H02B 11/133 |
| 2002/0163254 A1* | 11/2002 | Novinsky | H02B 11/173 |
| | | | 307/43 |
| 2004/0231875 A1* | 11/2004 | Rasmussen | H05K 7/1497 |
| | | | 174/50 |
| 2011/0136353 A1* | 6/2011 | Spitaels | H02B 1/056 |
| | | | 439/95 |
| 2018/0218865 A1* | 8/2018 | Stevens | H01H 71/0264 |
| 2023/0152872 A1* | 5/2023 | Nicholson | G06F 1/266 |
| | | | 713/310 |

OTHER PUBLICATIONS

Extended European Search Report from corresponding European Application No. 24200932.2 dated Mar. 3, 2025.

* cited by examiner

Primary Examiner — Zhengfu J Feng
(74) Attorney, Agent, or Firm — Quinn IP Law

(57) ABSTRACT

A microdata center power panel is configured to be mounted within a microdata center enclosure that is designed to support an IT equipment rack. The microdata center power panel includes a chassis configured to be coupled to a ceiling of the microdata center enclosure and at least one circuit breaker supported by the chassis. The at least one circuit breaker is positioned above the IT equipment rack within the microdata center enclosure.

23 Claims, 7 Drawing Sheets

MICRODATA CENTER POWER PANEL

BACKGROUND OF DISCLOSURE

1. Field of Disclosure

The present disclosure is generally directed to apparatus and methods to provide power to loads within a microdata center. More specifically, the present disclosure is directed to a power panel that is configured to provide power to equipment supported in a microdata center while conserving space within the microdata center.

2. Discussion of Related Art

A rack power panel is provided to distribute power to various components housed within an equipment rack, such as a microdata center. For example, such components can include power distribution units, cooling devices, security systems and fire-suppression systems. The power panel is typically installed inside the equipment rack in a position that may obstruct other components from being installed, takes up valuable IT space, and/or is inaccessible once the rack components are installed.

SUMMARY OF DISCLOSURE

One aspect of the present disclosure is directed to a microdata center power panel configured to be mounted within a microdata center enclosure configured to support an IT equipment rack. In one embodiment, the microdata center power panel comprises a chassis configured to be coupled to a ceiling of the microdata center enclosure and at least one circuit breaker supported by the chassis, the at least one circuit breaker being positioned above the IT equipment rack within the microdata center enclosure.

Embodiments of the microdata center further may include one or more connectors supported by the chassis and coupled to the at least one circuit breaker. The one or more connectors may be provided to couple to a rack power distribution unit. The one or more connectors may include two connectors: a first connector being provided to couple to a rack power distribution unit and a second circuit breaker being provided to couple to a condenser associated with a cooling rack. The chassis may be elongated to extend substantially across a width of the microdata center enclosure. At least one circuit breaker switch may be located on a downwardly facing surface of the chassis. The at least one circuit breaker may be provided to couple to a rack power distribution unit. The at least one circuit breaker may include two circuit breakers; a first circuit breaker being provided to couple to a rack power distribution unit and a second circuit breaker being provided to couple to a condenser associated with a cooling rack. The microdata center power panel further may include at least one external circuit breaker coupled to the chassis and connected to main power. The at least one external circuit breaker may be coupled to the at least one circuit breaker. The at least one external circuit breaker may be positioned along a vertical side of the microdata center enclosure. The at least one circuit breaker may be configured to couple to at least one of a rack power distribution unit, a condenser associated with a cooling rack, security devices or a fire-suppression system.

Another aspect of the present disclosure is directed to a method of assembling a microdata center power panel within a microdata center enclosure of the type configured to support an IT equipment rack. In one embodiment, the method comprises securing a chassis of a microdata center power panel to a ceiling of the microdata center enclosure; and coupling at least one circuit breaker of the microdata center power panel to an IT equipment rack of the microdata center enclosure. The at least one circuit breaker is positioned above the IT equipment rack within the microdata center enclosure.

Embodiments of the method further may include coupling one or more connector supported to the at least one circuit breaker. The one or more connector may be supported by the chassis. The one or more connectors may be provided to couple to a rack power distribution unit. The one or more connector may include two connectors: a first connector being provided to couple to a rack power distribution unit and a second circuit breaker being provided to couple to a connector. The at least one circuit breaker may be provided to couple to a rack power distribution unit. The at least one circuit breaker may include two circuit breakers: a first circuit breaker being provided to couple to a rack power distribution unit and a second circuit breaker being provided to couple to a condenser associated with a cooling rack. The method further may include coupling at least one external circuit breaker to the chassis, the at least one external circuit breaker being connected to main power. The at least one external circuit breaker may be coupled to the at least one circuit breaker. The at least one external circuit breaker may be positioned along a vertical side of the microdata center enclosure. The at least one circuit breaker may be configured to couple to at least one of a rack power distribution unit, a condenser associated with a cooling rack, security devices or a fire-suppression system.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
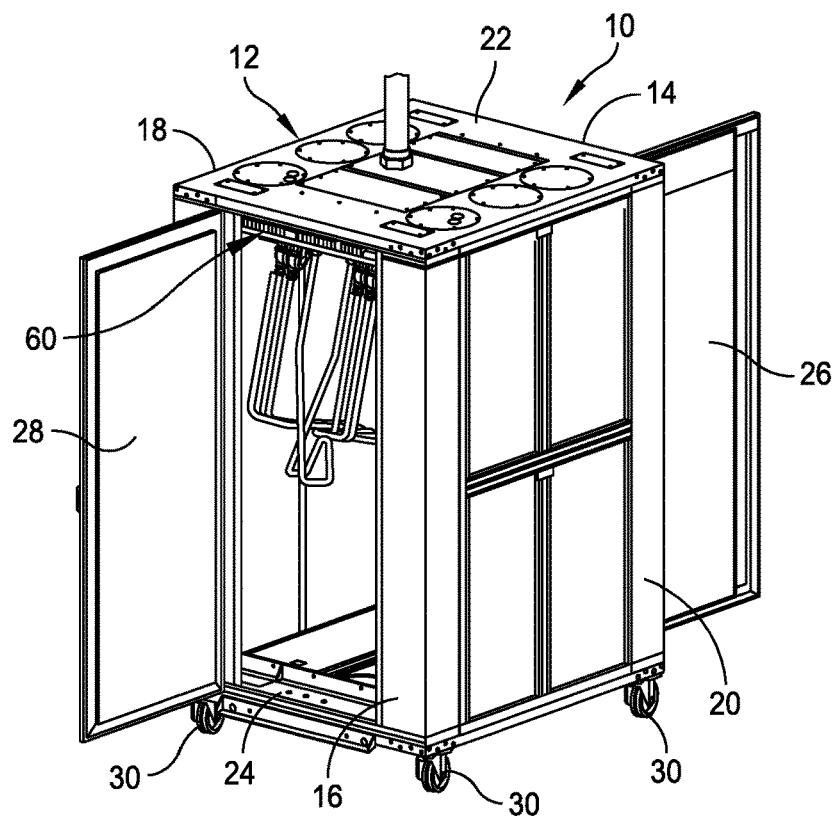
FIG. 1 is a perspective view of a microdata center enclosure having a power panel of the present disclosure.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A microdata center is a smaller or containerized (modular) data center architecture that is designed for computer workloads not requiring traditional facilities. While the size of the microdata center may vary from rack to container, the microdata center may include fewer than four servers in a single 19-inch rack. The microdata center may come with built-in security systems, cooling systems, and fire protection. Typically, there are standalone rack-level systems containing all the components found in a traditional data center, including in-rack cooling, power supply, power backup, security, and fire suppression.

Referring to the drawings, and more particularly to FIG. 1, a microdata center enclosure is generally indicated at 10. In one embodiment, the microdata center enclosure 10 embodies an equipment rack structure including a frame assembly, generally indicated at 12. The microdata center enclosure 10 includes a front 14, a back 16, opposite sides 18, 20, a top 22 and a bottom 24. The top 22 of the microdata center enclosure 10 is sometimes referred to herein as a ceiling and the bottom 24 of the microdata center enclosure is sometimes referred to herein as a floor. As shown, the microdata center enclosure 10 includes a front door 26 hingedly attached to the frame assembly 12 at the front 14 of the microdata center enclosure 10 to allow access to an interior of the microdata center enclosure. The microdata center enclosure 10 further includes a back door 28 hingedly attached to the frame assembly 12 at the back 16 of the microdata center enclosure 10 to allow additional access to the interior of the microdata center enclosure.

The microdata center enclosure 10 is configurable to accommodate equipment having a variety of shapes and sizes. In one embodiment, the microdata center enclosure 10 is configured to support an IT equipment rack within the interior of the microdata center enclosure. In the shown embodiment, the IT equipment rack and any related equipment is removed to more clearly view aspects of the present disclosure. In at least one embodiment, the microdata center enclosure 10 may be configured to support an IT equipment rack that includes a 19-inch rack; however, the microdata center enclosure can be configured to accommodate and support any size of rack, including but not limited to a 23-in rack. In one embodiment, the microdata center enclosure 10 further includes casters or wheels, each indicated at 30 provided at the bottom 24 of the microdata center enclosure to enable the movement of the microdata center enclosure on a horizontal surface. Leveling feet (not shown) can be provided to level the microdata center enclosure 10 once the microdata center enclosure is positioned at a desired location.

In one example, as shown and described with reference to FIG. 9 below, a 19-inch rack embodies a standardized frame or enclosure configured to mount electronic equipment modules. The interior of the IT equipment rack is configured to slidably mount electronic modules within the IT equipment rack. Such electronic modules may include computer servers, telecommunications equipment, networking equipment, audiovisual production equipment, music production equipment, and scientific equipment. The IT equipment rack further may be configured to support an uninterruptible power supply (UPS), which is provided to supply power to the electronic modules within the IT equipment rack. The microdata center enclosure is configured to provide power to the rack to power the equipment supported by the rack.

The microdata center enclosure 10 further is configured to support other types of equipment, such as rack power distribution units (rPDUs). In one embodiment, the rPDU is an elongate device including multiple outlets along a length of the device to distribute electric power, especially to the electronic modules supported by the IT equipment rack. The rPDU may be configured in any desired configuration. A basic rPDU may be configured to provide power from an input to several outlets. An intelligent rPDU may be configured to enable remote management of the rPDU as well as providing information to the operator of the rPDU, including power metering information, power outlet on/off control and/or alarms. FIG. 9 illustrates the microdata center enclosure including an rPDU in addition to the IT equipment rack.

Figure 2:
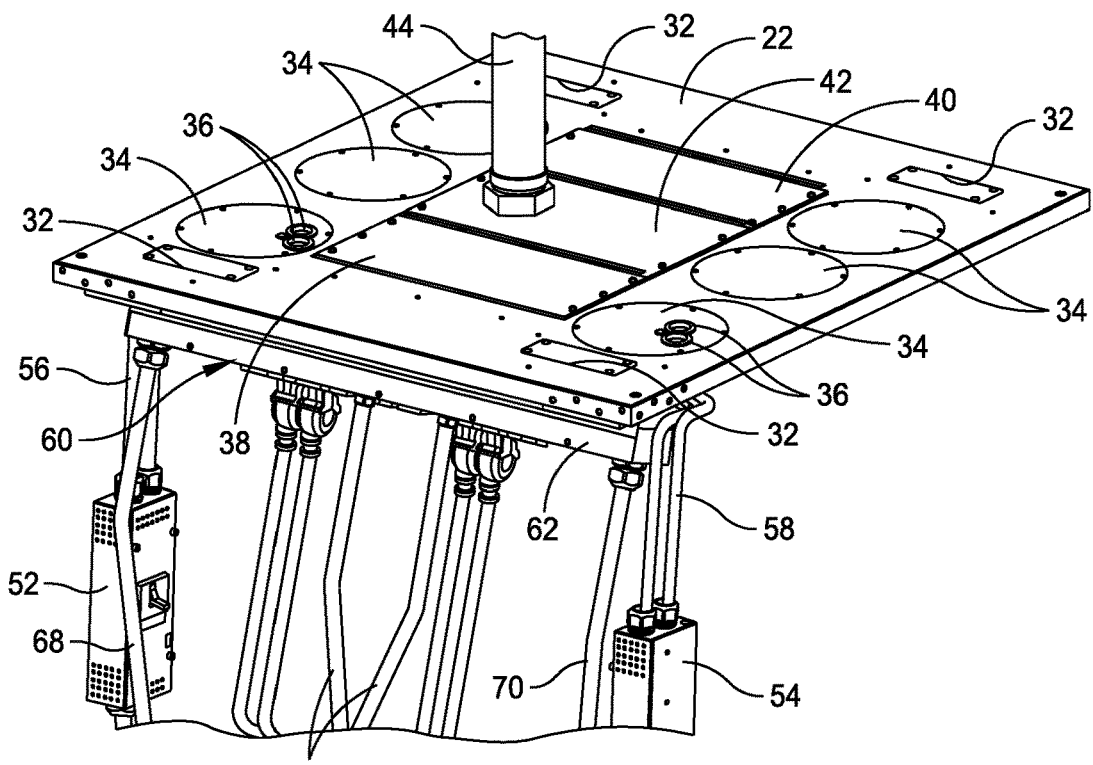
FIG. 2 is a top perspective view of a portion of the microdata center enclosure having the power panel.

Referring to FIG. 2, the top or ceiling 22 of the microdata center enclosure 10 is shown. The ceiling 22 of the microdata center enclosure 10 includes four cable entry cutouts, each indicated at 32, six air duct covers, each indicated at 34, and two refrigeration line openings, each indicated at 36, provided in two of the air duct openings 34. The cable entry cutouts 32 are provided to enable cables and wiring to enter the microdata center enclosure 10 to provide networking and communication lines to the electronic equipment supported by the microdata center enclosure. The air duct openings 34 are provided to supply cool air to and draw hot air from the interior of the microdata center enclosure 10, with the two refrigeration line openings 36 being provided to supply cooling fluid to cooling units provided in the microdata center enclosure. The ceiling 22 of the microdata center enclosure 10 further includes a power panel access cover 38, a signal/low voltage wiring box cover 40, and a building power drop plate 42, which provides building power to the microdata center enclosure. As shown, a PVC pipe 44 is secured to the building power drop plate 42 to enable power lines to enter the interior of the microdata center enclosure 10.

Figure 3:
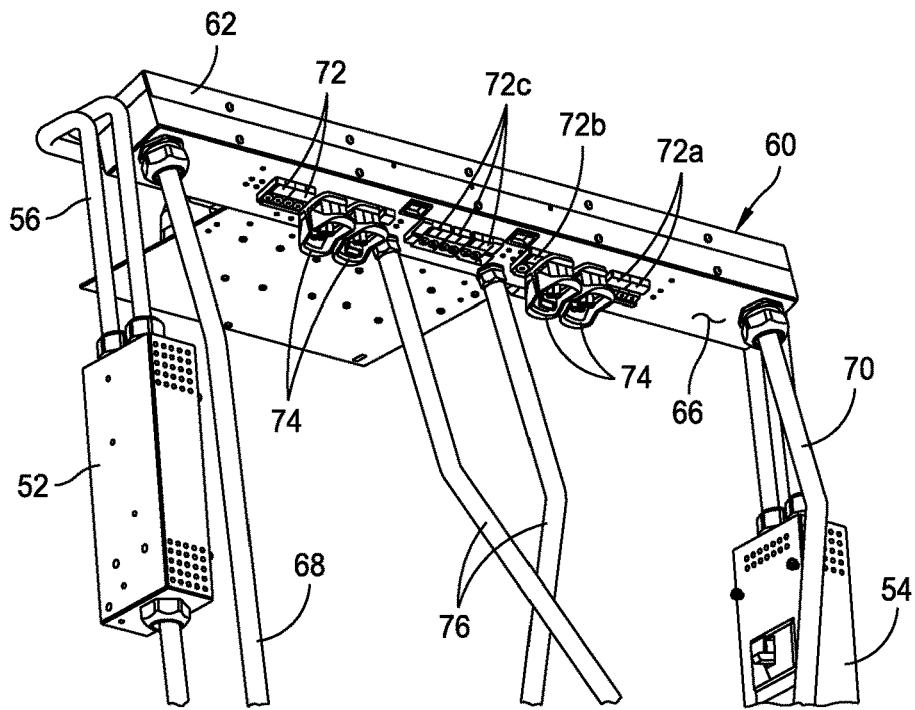
FIG. 3 is a bottom perspective view of the power panel.
Figure 4:
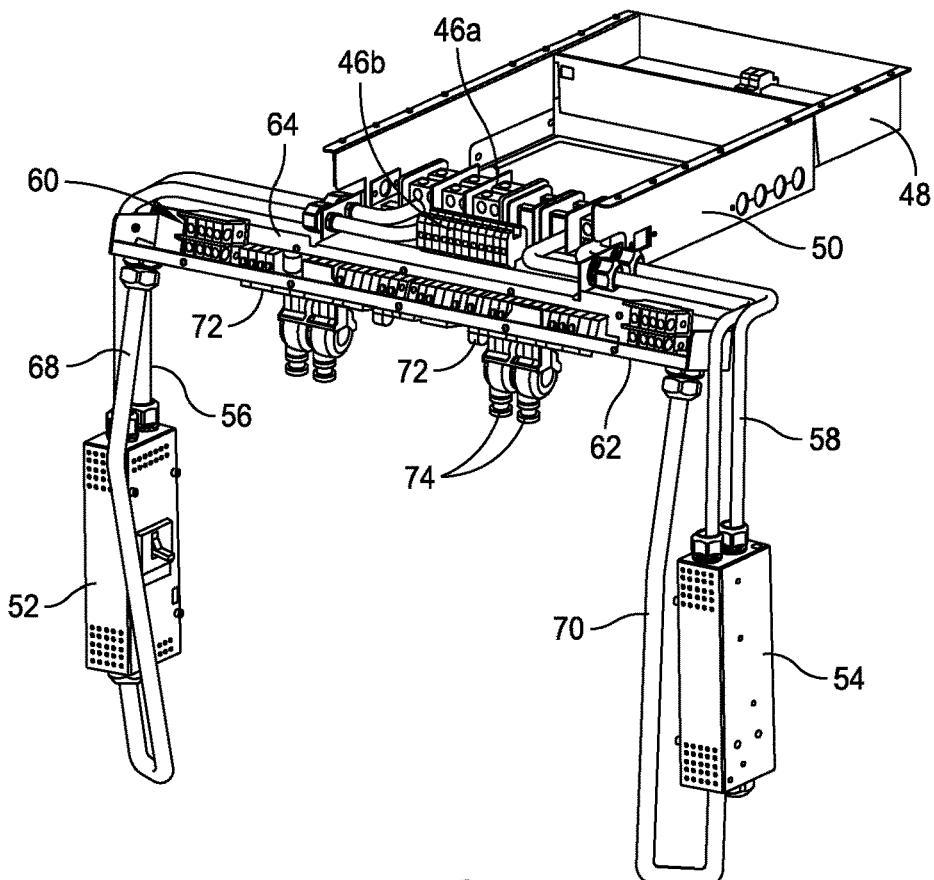
FIG. 4 is another top perspective view of the power panel having covers removed to reveal interiors of wiring and power boxes.

Referring additionally to FIGS. 3 and 4, the microdata center enclosure 10 further includes large input terminal blocks, together indicated at 46a, which are accessible from the power panel access cover 38 to provide power to the microdata center enclosure from the building power lines. The terminal blocks 46a are used to receive power from a main line input provided by pipe 44 and distribute power. The microdata center enclosure 10 further includes smaller terminal blocks, together indicated at 46b, which are used to output power to equipment within the microdata center enclosure 10, including cooling equipment.

The microdata center enclosure 10 further includes a signal/low voltage wiring box 48, which is accessible from the signal/low voltage wiring box cover 40, and a power box 50, which is accessible from the power panel access cover 38. In one embodiment, the terminal blocks 46a, 46b are supported by the power box 50 and configured to provide power to two external disconnect circuit breakers 52, 54, which are disposed along respective vertical sides 18, 20 of the microdata center enclosure 10. As shown, the external disconnect circuit breaker 52 is connected to the terminal blocks 46a by conductor cables, together indicated at 56. Similarly, the external disconnect circuit breaker 54 is connected to the terminal blocks 46a by conductor cables, together indicated at 58. The circuit breakers 52, 54 can be suitably mounted along respective sides 18, 20 of the microdata center enclosure 10 out of the way of the IT equipment rack when positioned inside the microdata center enclosure. Each circuit breaker 52, 54 can be configured to include a switch to operate the circuit breaker.

Figure 5:
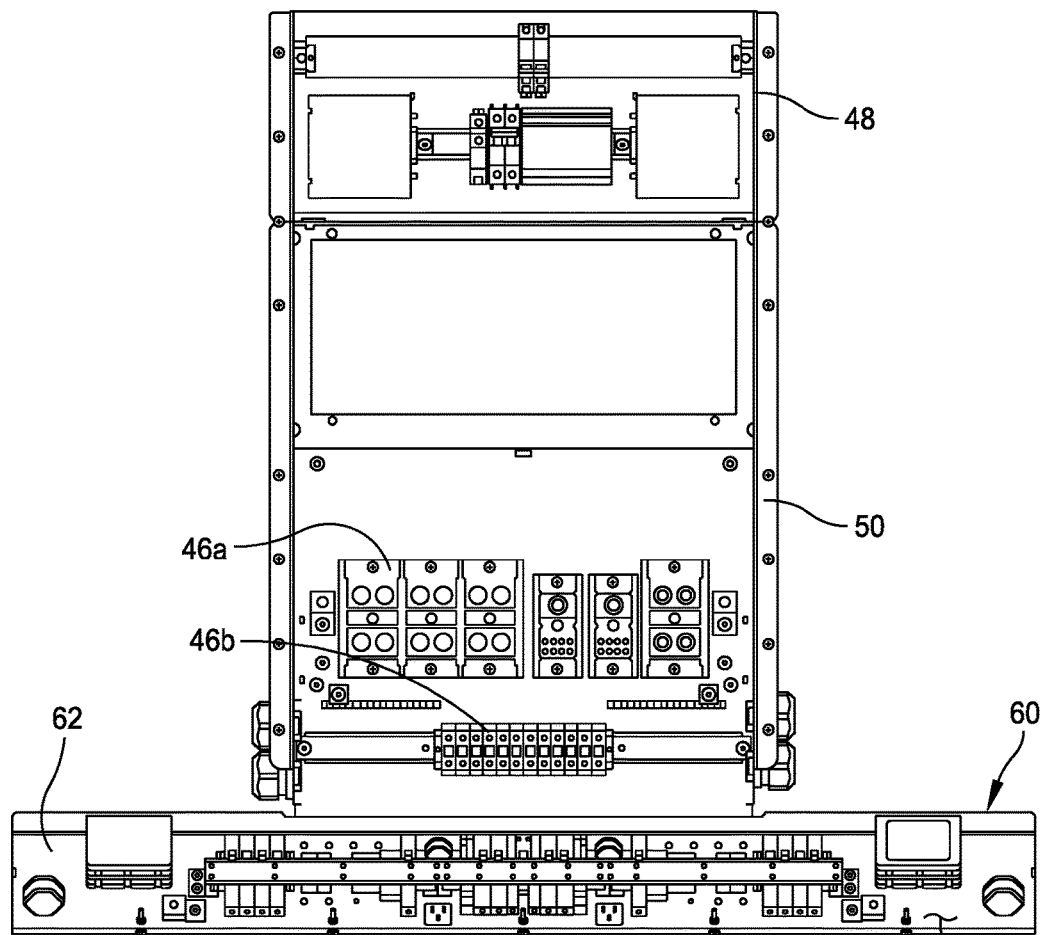
FIG. 5 is a top view of the power panel showing an exemplary configuration.
Figure 6:
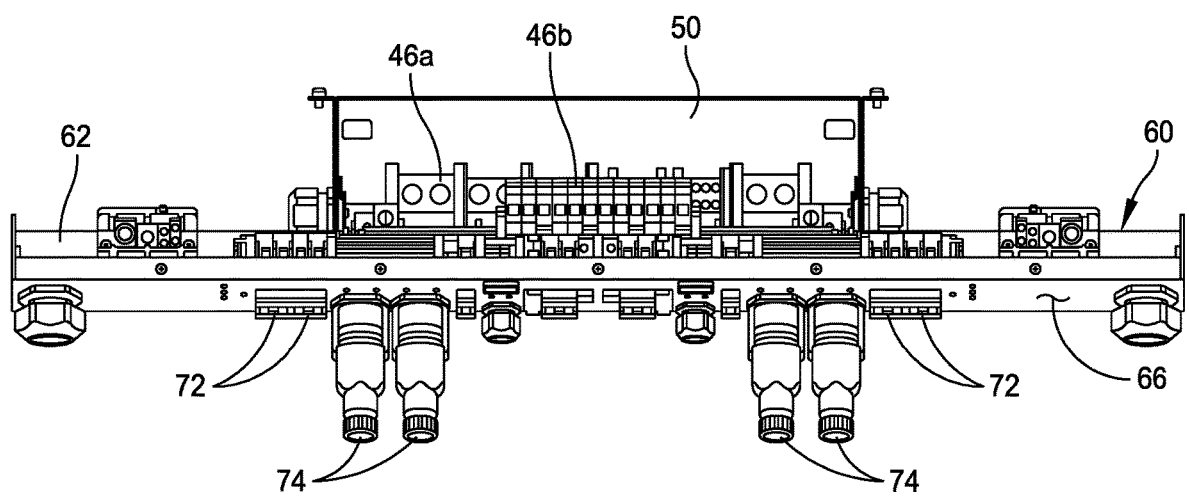
FIG. 6 is a side view of the power panel showing the exemplary configuration.
Figure 7:
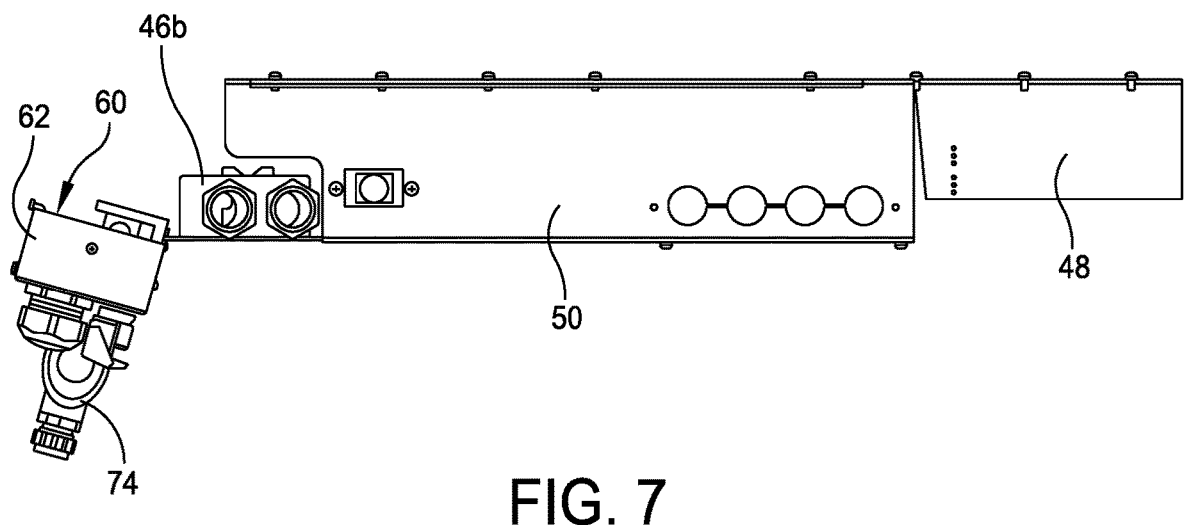
FIG. 7 is a side view of the power panel.

With additional reference to FIGS. 5-7, the microdata center enclosure 10 further includes a power panel, generally indicated at 60, which is mounted within the frame assembly 12 of the microdata center enclosure on a bottom surface of the ceiling 22 of the microdata center enclosure. As shown, the microdata center enclosure 10 includes an elongate chassis 62 configured to be secured to the frame assembly 12 so that the elongate chassis extends from one side 18 of the microdata center enclosure to the opposite side 20 of the microdata center enclosure. In one embodiment, the chassis 62 power panel 60 embodies a rectangular-shaped structure configured to support equipment used to distribute power from the main power from PVC pipe 44 and the terminal blocks 46a, 46b to the electronic equipment supported by the IT equipment rack within the microdata center enclosure 10. The chassis 62 of the power panel 60 includes a top 64 that faces the ceiling 22 when mounting the power panel within the frame assembly 12 of the microdata center enclosure 10. The chassis 62 of the power panel 60 further includes a bottom 66 that faces the IT equipment rack when provided in the microdata center enclosure 10. The result is that the elongate chassis 62 of the power panel 60 extends substantially across a width of the frame assembly 12 of the microdata center enclosure 10 out of the way of the IT equipment rack. Power is delivered to the power panel 60 by the disconnect circuit breakers by conductor cables 68, 70, which are connected to external circuit breakers 52, 54, respectively.

The elongate chassis 62 of the power panel 60 is configured to support several circuit breakers, each indicated at 72, which are provided on a bottom facing surface of the bottom 66 of the chassis of the power panel, and positioned at the top 22 of the microdata center enclosure 10 so that the circuit breakers are positioned above the IT equipment rack within the microdata center enclosure. The power panel 60 can be configured to support a desired number of circuit breakers 72. Circuit breakers are typically provided to protect each circuit from damage caused by excess current from an overloaded circuit or from a short circuit. Each circuit breaker 72 is designed to interrupt current flow after a fault is detected and can be reset manually to resume normal operation. The circuit breakers 72 shown and described herein can be designed to include switches for a desired number of circuits. In the shown embodiment, the circuit breakers 72 are each located on a downwardly facing surface of the bottom 66 of the chassis 62 of the power panel 60.

Figure 8:
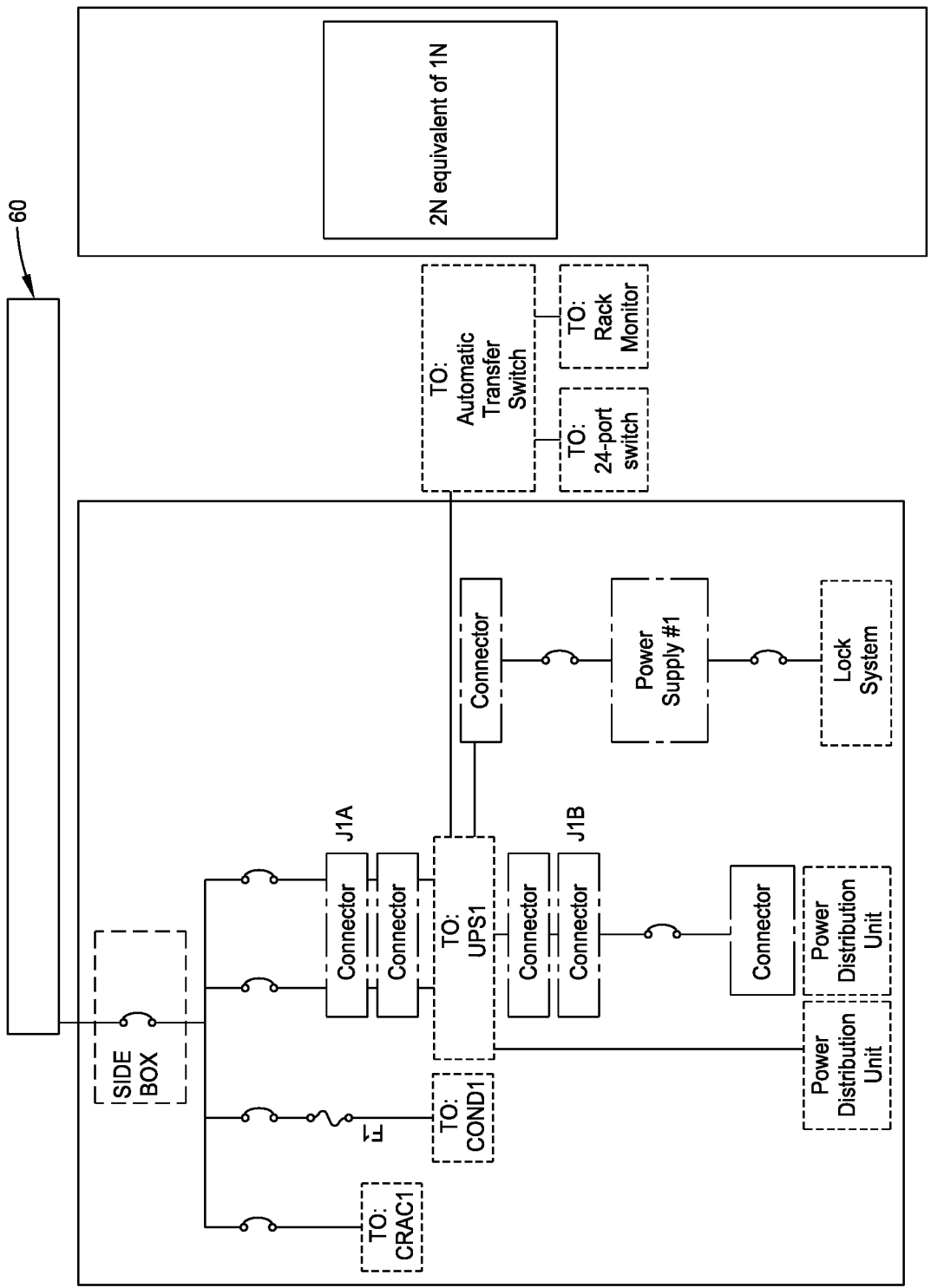
FIG. 8 is a schematic view of a rack panel of an embodiment of the present disclosure.

In one embodiment, shown throughout the drawing figures, circuit breakers 72a are provided to couple the power panel 60 to a UPS. Circuit breaker 72b is provided to couple the power panel 60 to a rPDU. Circuit breakers 72c are provided to couple the power panel 60 to a condenser and to a cooling unit. For example, the condenser may be powered through several circuit breakers (circuit breakers 72c) in series with a fuse. The other circuit breakers 72 may be provided to couple the power panel 60 to other pieces of electronic equipment supported by the frame assembly 12 of the microdata center enclosure 10 and/or the IT equipment rack provided in the microdata center enclosure. For example, the other circuit breakers 72 may be used to couple the power panel 60 to security devices and/or a fire-suppression system associated with the microdata center enclosure 10. An exemplary configuration is shown in FIG. 8.

In some embodiments, the power panel 60 further may include several connectors, each indicated at 74, which are provided to couple equipment to the circuit breakers 72. In one embodiment, one connector 74 is provided to couple circuit breaker 72a to the UPS. In some embodiments, whips, each indicated at 76, may be provided to connect the power panel 60 to equipment supported by the frame assembly 12 of the microdata center enclosure 10. The whips 76 may be coupled to circuit breakers 72 associated with the power panel 70. For example, whip 76 is provided to couple circuit breaker 72b to the rack PDU and a connector associated with terminal block 46b is provided to couple circuit breaker 72c to a cooling rack and a condenser associated with the cooling rack.

In one embodiment, with reference to FIGS. 6 and 7, the chassis 62 of the power panel 60 can be secured to the frame assembly 12 of the microdata center enclosure 10 and/or the power box 50 at an angle with respect to the power box. In the shown embodiment, the top 64 of the chassis 62 is disposed at an acute angle with respect to a top of the power box 50. In this position, the bottom 66 of the chassis 62 is disposed an obtuse angle with respect to the bottom 24 of the microdata center enclosure 10.

In the shown embodiment, a 50 Hertz (Hz) power panel is described. However, it should be understood that the power panel can be configured to 60 Hz. FIG. 8 illustrates a schematic view of a 50 Hz, single feed power panel. As shown, circuit breakers are provided to feeds to a CRAC unit, an air conditioning unit, and a UPS. Further, the circuit breakers can be coupled to a rack powered distribution unit (rPDU) associated with an IT equipment rack. Other configurations are contemplated. For example, the power panel can be configured as a 50 Hz unit (single or dual feed) or a 60 Hz unit (single or dual feed) at the time of installation, capable of supporting 8 kilowatts (kW) of loads, with or without redundancy, e.g., an additional 8 kW. Moreover, the power panel further can be configured as top or bottom feed at the time of installation.

Figure 9:
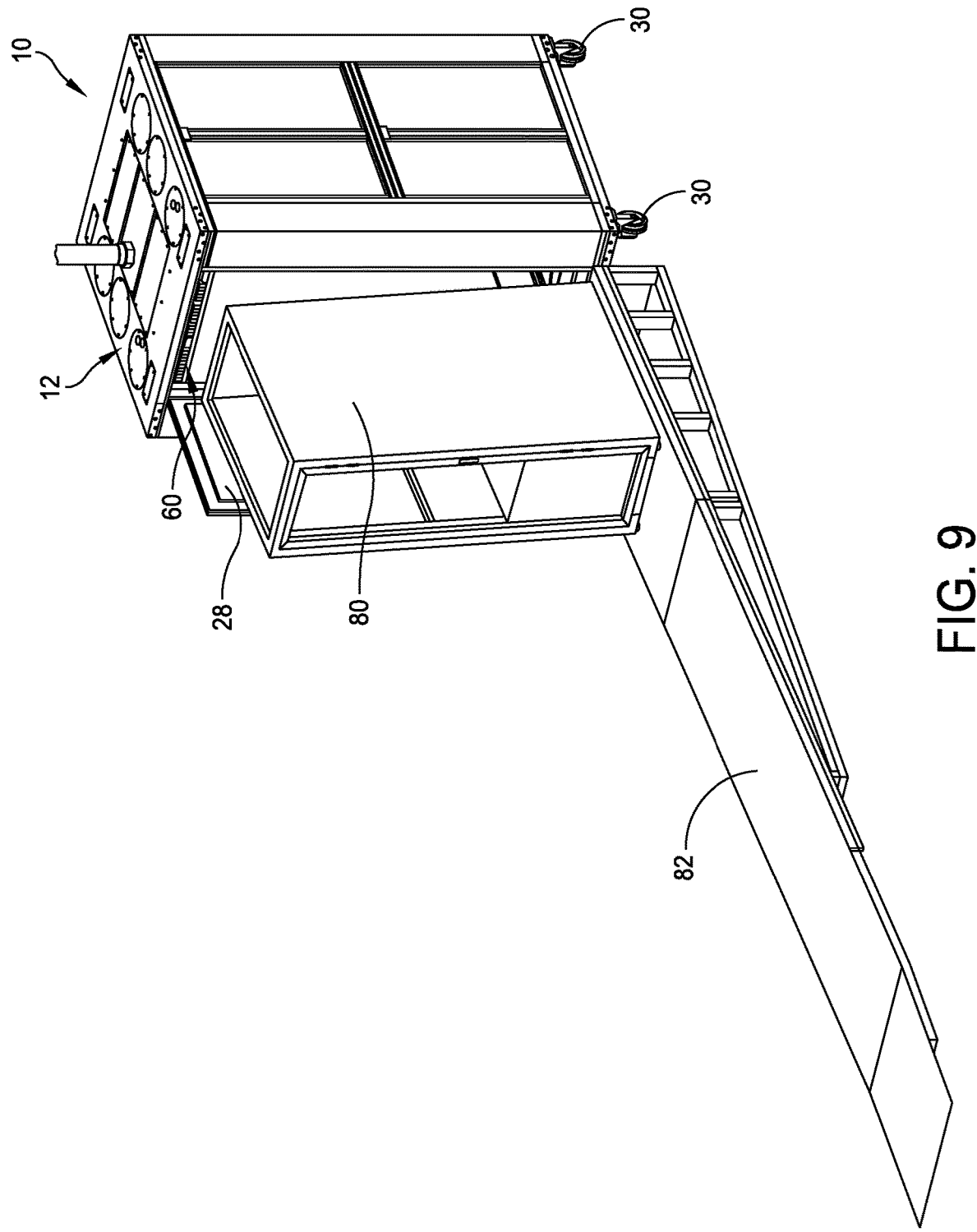
FIG. 9 is a perspective view of an IT equipment rack being loaded into the microdata center enclosure.

Referring to FIG. 9, an IT equipment rack, indicated at 80, is shown being loaded into the microdata center enclosure 10 shown in FIG. 1, the microdata center enclosure having the power panel 60 (not shown). As shown, the IT equipment rack 80 is loaded into the microdata center enclosure 10 by utilizing a ramp 82, with the IT equipment rack being rolled into place within the microdata center enclosure. One or more cooling units can be positioned within the microdata center enclosure 10. As noted above, the interior of the IT equipment rack 80 can be configured to slidably mount electronic modules within the IT equipment rack, included computer servers, telecommunications equipment, networking equipment, audiovisual production equipment, music production equipment, and scientific equipment. As noted above, the IT equipment rack 80 can be configured with the rPDU having a plurality of outlets to power electronic equipment supported by the IT equipment rack.

For example, in one embodiment, the rPDU is secured within an interior side of the IT equipment rack and extends vertically from the top to the bottom of the IT equipment rack. The rPDU is provided with outlets positioned along a length of the rPDU to supply power to operational components within the IT equipment rack 80 including electronic modules and equipment supported by the IT equipment rack. Once installed, the second circuit breaker 72b is connected to the rPDU. The UPS is provided to supply power to the electronic modules within the IT equipment rack. The microdata center enclosure is configured to provide power to the rack to power the equipment supported by the rack.

Figure 10:
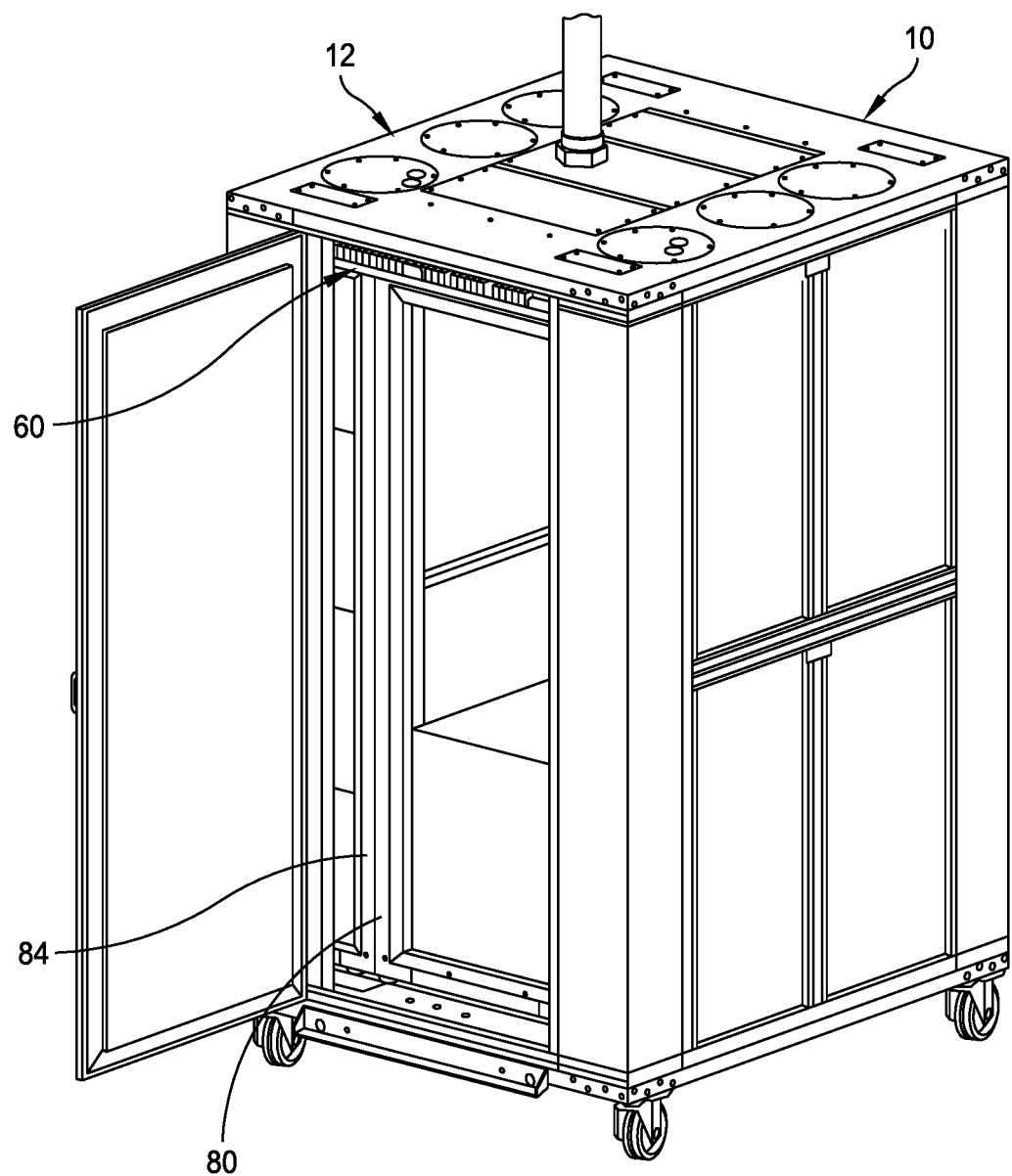
FIG. 10 is a perspective view of the microdata center enclosure including the IT equipment rack and a cooling unit.

Referring to FIG. 10, the microdata center enclosure 10 is shown with the IT equipment rack 80 within the interior of the microdata center enclosure. The IT equipment rack 80 can be configured to support a variety of electronic equipment, including but not limited to computer servers, telecommunications equipment, networking equipment, UPSs, audiovisual production equipment, music production equipment, and scientific equipment. An operator assembling the microdata center enclosure 10 can assemble the IT equipment rack 80 with desired electronic modules and equipment prior to installing the IT equipment rack within the microdata center enclosure 10. Once installed, the first circuit breaker 72a is connected to the UPS supported by the IT equipment rack 80.

As noted above, the IT equipment rack 80 further can be configured to receive an rPDU within the microdata center enclosure 10. As shown, the rPDU is secured to a side of the IT equipment rack 80 and extends vertically from the top to the bottom of the IT equipment rack adjacent to the front of the IT equipment rack. The rPDU is provided to supply power to operational components within the microdata center enclosure 10 including electronic modules and equipment supported by the IT equipment rack 80. Once installed, the second circuit breaker 72b is connected to the rPDU.

The microdata center enclosure 10 further can be configured to receive other equipment, such as a computer room air conditioning (CRAC) rack, indicated at 84, within the frame assembly 12 of the microdata center enclosure. As shown, the CRAC rack 84 can be positioned within the frame assembly 12 of the microdata center enclosure 10 adjacent to the IT equipment rack 80. Once installed, the third circuit breaker 72c is connected to the CRAC rack 84, which supports or is otherwise connected to a condenser. As is known, the CRAC rack is provided to cool electronic modules and equipment supported by the IT equipment rack 80 of the microdata center enclosure 10.

In some embodiments, a method of assembling a microdata center power panel 60 within a microdata center enclosure 10 of the type configured to support an IT equipment rack 80 is provided. In one embodiment, the method includes securing the chassis 62 of the power panel 60 to the ceiling 22 of the microdata center enclosure 10. As described above, the chassis 62 of the power panel 60 can be secured to the frame assembly 12 by suitable fasteners. In another embodiment, the chassis 62 of the power panel 60 can be secured to the power box 50, or both to the frame assembly 12 and the power box 50. The method further includes coupling the circuit breakers 72 of the power panel 60 to the electronic modules and equipment supported by the IT equipment rack 80. When assembled, the circuit breakers 72 are positioned above the IT equipment rack 80 within the microdata center enclosure 10.

In one embodiment, the first circuit breaker 72a is provided to couple the power panel 60 to the UPS. The second circuit breaker 72b, is provided to couple the power panel 60 to a rPDU. The third circuit breaker 72c is provided to couple the power panel 60 to a condenser associated with a cooling rack. The other circuit breakers 72 may be provided to couple the power panel 60 to other pieces of electronic modules and equipment supported by the microdata center enclosure 10 and/or the IT equipment rack 80 provided in the microdata center enclosure, such as security devices and/or a fire-suppression system associated with the microdata center enclosure.

It should be understood that the power panel of embodiments of the present disclosure does not obstruct rack component installation, does not take up valuable IT space, and is readily accessible before and after all rack components are installed. Embodiments of the power panel include mounting the power panel within the interior of the microdata center enclosure adjacent to the top of the microdata center enclosure, with the circuit breakers being positioned on the top portion of the microdata center enclosure and the main circuit breakers on the side.

In some embodiments, the provision of the power panel standardizes and optimizes power distribution to maximize available U-space in enclosure for end user/customer equipment. The power panel can be configured to a desired modular scheme for power distribution to facilitate assembly both in the factory and in the field as an "assemble on site" unit. For example, the outer structure of the microdata center can be shipped as a "flat pack" in a crate, which can fit through openings (and in elevators) that a fully assembled microdata center may not fit. The power panel can be shipped to customer fully tested, with all pre-tested parts ready to assemble.

The installation of the power panel requires limited involvement from an electrician, other than for landing building wires. The power panel allows for granular current loading via multiple circuit breakers. One benefit is that the IT equipment rack can be loaded with end user/customer equipment prior to being installed within the microdata center enclosure. With the power panel, the U-spaces of the IT equipment rack can be occupied by equipment requiring power distribution.

In some embodiments, the power panel can be configured with top or bottom power feed.

In some embodiments, the power panel can be configured with single power feed or dual power feed.

In some embodiments, the power panel can be used for a CRAC rack.

In some embodiments, the power panel can be configured to monitor the status of the enclosure, e.g., monitor the status of door latches.

In some embodiments, the power panel can be configured with a single touch pad for front and rear door access to open one or both doors.

In some embodiments, the power panel can be configured with optional features, including but not limited to current monitoring, shunt trip/emergency power off (EPO), LED strip lighting, and/or remote door opening.

In some embodiments, the power panel can be provided with any number of circuit breakers depending on the intended IT equipment rack configuration. The power panel is scalable to achieve a variety of configurations.

In some embodiments, the provision of the power panel enables an operator to roll in the IT equipment rack since the power panel is provided adjacent the ceiling of the microdata center enclosure. The operator also can easily replace the IT equipment rack with refreshed electronic equipment without requiring an electrician. Once the power panel is installed, the electronic equipment provided in the IT equipment rack is easily plugged into the power panel and/or the rPDU provided within the microdata center enclosure. An electrician is only required to initially install the power panel. Because of the above features, on-site assembly is more feasible and economical, quicker, and more dependable.

In some embodiments, the power panel can be configured with a redundant feed to the UPS, using one power cord and two circuit breakers, one circuit breaker feeding a main input and the other circuit breaker feeding a bypass input. This arrangement is provided to enable a short circuit on the output to be cleared by one circuit breaker and then, if it opens in the process of clearing the short, the other circuit breaker is able to continue powering the load.

In some embodiments, an operator can be notified if any door latch is not latched and/or locked. For example, if an operator receives a notification that one of the doors was not latched and/or locked, but the door appeared to be closed, the operator can obtain a current reading for that door and determine whether a latch is not latched.

In some embodiments, the power panel can be configured to include a keypad on one of the doors, to control both front and rear doors independently, e.g., by two different codes. In some embodiments, the power panel can be configured to include a rocker switch labeled "Arm/Disarm," which is provided to prevent accidental discharge of a fire suppressant from a fire suppression system. The rocker switch can enable testing of the smoke detector.

In some embodiments, if an operator would like to monitor for an overtemperature condition, and enable the power panel to automatically unlock and open both front and rear doors to cool off the interior of the MDC.

In some embodiments, the microdata center enclosure can be configured to include a single CRAC rack for a 1N solution, and two CRAC racks for a 2N solution, with each CRAC unit being one-half the width of a standard equipment rack.

In some embodiments, the rack panel can be coupled to a controller configured to operate the power panel. Various controllers may be provided to execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A microdata center power panel configured to be mounted within a microdata center enclosure configured to support an IT equipment rack, the microdata center power panel comprising:
   a chassis configured to be coupled to a ceiling of the microdata center enclosure; and
   at least one circuit breaker supported by the chassis, the at least one circuit breaker being positioned above the IT equipment rack within the microdata center enclosure.

2. The microdata center power panel of claim 1, wherein the chassis is elongated to extend substantially across a width of the microdata center enclosure.

3. The microdata center power panel of claim 1, wherein at least one circuit breaker switch is located on a downwardly facing surface of the chassis.

4. The microdata center power panel of claim 1, wherein the at least one circuit breaker is provided to couple to a rack power distribution unit.

5. The microdata center power panel of claim 1, wherein the at least one circuit breaker includes two circuit breakers: a first circuit breaker being provided to couple to a rack power distribution unit and a second circuit breaker being provided to couple to a condenser associated with a cooling rack.

6. The microdata center power panel of claim 1, further comprising one or more connectors supported by the chassis and coupled to the at least one circuit breaker.

7. The microdata center power panel of claim 6, wherein the one or more connectors are provided to couple to a rack power distribution unit.

8. The microdata center power panel of claim 6, wherein the one or more connectors includes two connectors: a first connector being provided to couple to a rack power distribution unit and a second connector being provided to couple to a condenser associated with a cooling rack.

9. The microdata center power panel of claim 1, further comprising at least one external circuit breaker coupled to the chassis and connected to main power.

10. The microdata center power panel of claim 9, wherein the at least one external circuit breaker is coupled to the at least one circuit breaker.

11. The microdata center power panel of claim 9, wherein the at least one external circuit breaker is positioned along a vertical side of the microdata center enclosure.

12. The microdata center power panel of claim 1, wherein the at least one circuit breaker is configured to couple to at least one of a rack power distribution unit, a condenser associated with a cooling rack, security devices or a fire-suppression system.

13. A method of assembling a microdata center power panel within a microdata center enclosure of a type configured to support an IT equipment rack, the method comprising:
   securing a chassis of a microdata center power panel to a ceiling of the microdata center enclosure; and
   coupling at least one circuit breaker of the microdata center power panel to an IT equipment rack of the microdata center enclosure,
   wherein the at least one circuit breaker is positioned above the IT equipment rack within the microdata center enclosure.

14. The method of claim 13, wherein the at least one circuit breaker is provided to couple to a rack power distribution unit.

15. The method of claim 13, wherein the at least one circuit breaker includes two circuit breakers: a first circuit breaker being provided to couple to a rack power distribution unit and a second circuit breaker being provided to couple to a condenser associated with a cooling rack.

16. The method of claim 13, further comprising coupling one or more connectors supported to the at least one circuit breaker.

17. The method of claim 16, wherein the one or more connectors are supported by the chassis.

18. The method of claim 16, wherein the one or more connectors are provided to couple to a rack power distribution unit.

19. The method of claim 16, wherein the one or more connectors include two connectors: a first connector provided to couple to a rack power distribution unit and a second circuit breaker connector provided to couple to a connector.

20. The method of claim 13, further comprising coupling at least one external circuit breaker to the chassis, the at least one external circuit breaker being connected to main power.

21. The method of claim 20, wherein the at least one external circuit breaker is coupled to the at least one circuit breaker.

22. The method of claim 20, wherein the at least one external circuit breaker is positioned along a vertical side of the microdata center enclosure.

23. The method of claim 13, wherein the at least one circuit breaker is configured to couple to at least one of a power distribution unit, a condenser associated with a cooling rack, security devices or a fire-suppression system.

\* \* \* \* \*